United States Patent
Yoo et al.

(10) Patent No.: US 9,892,981 B2
(45) Date of Patent: Feb. 13, 2018

(54) METHOD AND APPARATUS FOR DEPOSITING PHOSPHOR ON SEMICONDUCTOR-LIGHT EMITTING DEVICE

(71) Applicant: SAMSUNG ELECTRONICS CO., LTD., Suwon-si, Gyeonggi-do (KR)

(72) Inventors: Cheol-Jun Yoo, Cheonan-si (KR); Seong-Jae Hong, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 896 days.

(21) Appl. No.: 14/137,619

(22) Filed: Dec. 20, 2013

(65) Prior Publication Data

US 2014/0106480 A1  Apr. 17, 2014

Related U.S. Application Data

(62) Division of application No. 13/314,783, filed on Dec. 8, 2011, now Pat. No. 8,672,308.

(30) Foreign Application Priority Data

Dec. 22, 2010  (KR) .................. 10-2010-0132819

(51) Int. Cl.
    *H01L 21/66* (2006.01)
    *H01L 33/00* (2010.01)
    (Continued)

(52) U.S. Cl.
    CPC ............ *H01L 22/20* (2013.01); *H01L 33/005* (2013.01); *H01L 33/0095* (2013.01);
    (Continued)

(58) Field of Classification Search
    CPC ......... H01L 33/00; H01L 33/05; H01L 33/50; H01L 33/505; H01L 33/0079;
    (Continued)

(56) References Cited

U.S. PATENT DOCUMENTS 3,947,953 A * 4/1976 Okada ................ H01L 21/50
                                                       156/153
5,242,641 A   9/1993 Homer et al.
(Continued)

FOREIGN PATENT DOCUMENTS

| JP | 2002-170999 A | 6/2002 |
| KR | 2008-0055549 A | 6/2008 |
| WO | 2007/049187 A1 | 5/2007 |

OTHER PUBLICATIONS

Extended European Search Report issued in European Application No. 11194223.1 dated Jul. 1, 2014.

*Primary Examiner* — Bo Fan
(74) *Attorney, Agent, or Firm* — Muir Patent Law, PLLC (57) ABSTRACT

A method and apparatus for depositing a phosphor using transfer molding. The method includes: forming a plurality of light-emitting devices on a wafer and rearranging the light-emitting devices on a carrier substrate according to luminance characteristics of the plurality of light-emitting devices by examining the luminance characteristics of the plurality of light-emitting devices; depositing the phosphor on the rearranged light-emitting devices using transfer molding; and separating the light-emitting devices on the carrier substrate.

15 Claims, 5 Drawing Sheets

(51) Int. Cl.
  *H01L 33/50* (2010.01)
  *H01L 33/52* (2010.01)

(52) U.S. Cl.
  CPC .............. *H01L 33/50* (2013.01); *H01L 33/52* (2013.01); *H01L 2924/0002* (2013.01); *H01L 2933/0041* (2013.01)

(58) Field of Classification Search
  CPC ..... H01L 22/20; H01L 33/0095; H01L 33/52; H01L 33/005; H01L 2924/0002; H01L 2933/0041; B29C 33/00
  USPC ........................ 438/26, 15, 16, 7; 257/88, 98
  See application file for complete search history.

(56) References Cited

U.S. PATENT DOCUMENTS

| | | | |
|---|---|---|---|
| 6,176,008 B1 | 1/2001 | Ueoka | |
| 7,223,620 B2 | 5/2007 | Jager et al. | |
| 7,344,902 B2 | 3/2008 | Basin et al. | |
| 7,591,054 B2 | 9/2009 | Baughman | |
| 7,666,715 B2* | 2/2010 | Brunner | H01L 31/0203 257/100 |
| 7,765,682 B2 | 8/2010 | Hwang et al. | |
| 7,855,464 B2 | 12/2010 | Shikano | |
| 7,858,409 B2 | 12/2010 | Kessels et al. | |
| 7,910,387 B2 | 3/2011 | Chao | |
| 7,998,763 B2 | 8/2011 | Iwasaki et al. | |
| 2005/0062140 A1 | 3/2005 | Leung et al. | |
| 2008/0157103 A1* | 7/2008 | Chandra | H01L 33/505 257/88 |
| 2009/0200567 A1 | 8/2009 | Yoon | |
| 2009/0309114 A1* | 12/2009 | Lu | H01L 33/505 257/98 |
| 2010/0200882 A1* | 8/2010 | Kotani | C08G 59/3245 257/98 |
| 2011/0266569 A1* | 11/2011 | Basin | H01L 33/0079 257/98 |
| 2012/0153516 A1 | 6/2012 | Fuji et al. | |
| 2012/0164759 A1 | 6/2012 | Yoo et al. | |

\* cited by examiner

METHOD AND APPARATUS FOR DEPOSITING PHOSPHOR ON SEMICONDUCTOR-LIGHT EMITTING DEVICE

CROSS-REFERENCE TO RELATED APPLICATION

This application is a Divisional of U.S. application Ser. No. 13/314,783 filed on Dec. 8, 2011, which claims the benefit of Korean Patent Application No. 10-2010-0132819, filed on Dec. 22, 2010, in the Korean Intellectual Property Office, the disclosures of which are incorporated herein in its entirety by reference.

BACKGROUND

1. Field

The present disclosure relates to methods and apparatuses for depositing a phosphor on a semiconductor-light emitting device using transfer molding, and more particularly, to methods and apparatuses for depositing a phosphor on a semiconductor-light emitting device, in which the phosphor is efficiently deposited on the semiconductor-light emitting device using transfer molding by rearranging the phosphor according to luminance characteristics of manufactured light-emitting device chips.

2. Description of the Related Art

Light-emitting diodes (LEDs) are semiconductor-light emitting devices which convert an electric signal into light, have a longer life span than other light-emitting devices, and are driven at a low voltage. Currently, light fixtures using white LEDs having high brightness have been used to replace general light-emitting devices. A white LED may be manufactured by coating a red, green, or yellow phosphor on a light-emitting device that emits blue light or UV light.

Examples of depositing a phosphor on a general LED chips may include wafer level coating. In the wafer level coating, a plurality of LED chips are formed on a wafer and then a phosphor is deposited on the wafer before evaluating optical characteristics of each chip.

According to the wafer level coating, a phosphor is deposited only on the wafer and thus such a method may be applied only to a LED structure in which light is emitted to upper parts of the LED chips.

Also, in the wafer level coating, a phosphor paste is deposited while non-sorted LED chips are formed on the same wafer before the LED chips are bin sorted in the evaluation on optical characteristics of each chip. Accordingly, due to differences in the optical characteristics between the LED chips, white chips having non-uniform optical characteristics are manufactured and thus a yield of the entire process may be significantly decreased.

SUMMARY

Provided are methods for uniformly depositing a phosphor on a side and an upper part of light-emitting devices using transfer molding.

Provided are transfer molding apparatuses for uniformly depositing a phosphor on a side and an upper part of light-emitting devices.

Additional aspects will be set forth in part in the description which follows and, in part, will be apparent from the description, or may be learned by practice of the presented embodiments.

According to an aspect of the present invention, a method of depositing a phosphor using transfer molding includes: forming a plurality of light-emitting devices on a wafer and rearranging the light-emitting devices on a carrier substrate according to luminance characteristics of the plurality of light-emitting devices by examining the luminance characteristics of the plurality of light-emitting devices; depositing the phosphor on the rearranged light-emitting devices using transfer molding; and separating the light-emitting devices on the carrier substrate.

In the examining of the luminance characteristics of the plurality of light-emitting devices, the plurality of light-emitting devices formed on the wafer are separated and the luminance characteristics of each light-emitting device may be examined.

In the examining of the luminance characteristics, luminance wavelength, brightness, or reaction rate of each light-emitting device may be examined.

In the rearranging of the light-emitting devices on the carrier substrate, an adhesive layer may be formed on the carrier substrate and LED chips having the same luminance characteristics may be arranged on the adhesive layer.

The adhesive layer may include a photo-sensitive adhesive (PSA).

In the depositing of the phosphor, the carrier substrate, on which the light-emitting devices are arranged, may be installed on an apparatus for depositing a phosphor and the phosphor may be supplied to the light-emitting devices on the carrier substrate so as to deposit the phosphor on the light-emitting devices.

The phosphor may be deposited on the light-emitting devices except for electrode pads of the light-emitting devices.

According to another aspect of the present invention, an apparatus for depositing a phosphor includes: an upper die on which a carrier substrate on which light-emitting devices are arranged is installed; a lower die formed to correspond to the upper die; and a pot block formed at one side of the upper die and the lower die for supplying a phosphor material between the upper die and the lower die.

The lower die may include a plurality of pin holes formed to correspond to electrode pads of the light-emitting devices.

The apparatus may further include via pins formed in the pin holes.

The via pins may be connected to a pin drive plate disposed at lower part of the lower die through springs.

The pot block may include a hole and plunger formed at a bottom part of the hole which may move upward and downward in the hole.

The apparatus may further include a runner at the upper part of the pot block to function as a transport path through which the phosphor paste is transported.

The runner may be a groove-form structure formed at the lower surface of the upper part of the pot block.

The apparatus may further include an air bent slit formed in the upper die and the lower die.

The apparatus may further include comprising a release film contacting the lower die and the lower part of the pot block.

The release film may include polyvinyl chloride (PVC) or polyethylene terephthalate (PET).

The release film may have a thickness of about a few to a few tens of micrometers.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Hereinafter, methods and apparatuses for depositing a phosphor using transfer molding according to one or more embodiments of the present invention will be described in detail. In the drawings, the thicknesses of layers and regions are exaggerated for clarity.

Figure 1:
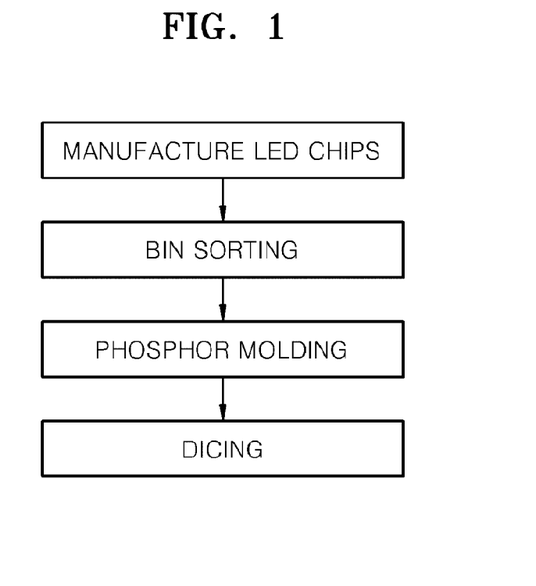
FIG. 1 is a flowchart illustrating a method of manufacturing a light-emitting display device including transfer molding, according to an embodiment of the present invention.

FIG. 1 is a flowchart illustrating a method of manufacturing a light-emitting display device, including transfer molding, according to an embodiment of the present invention.

Figure 2:
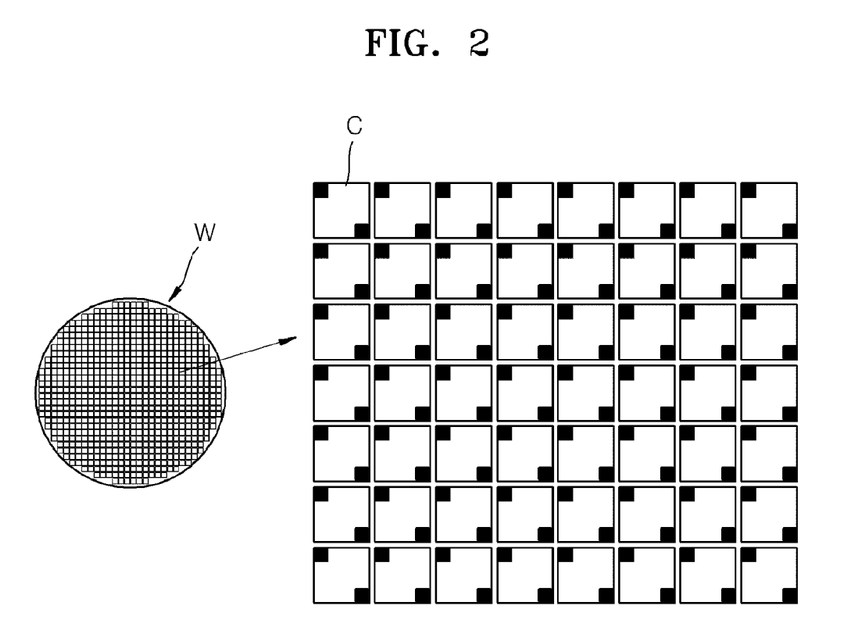
FIG. 2 illustrates an arrangement of a wafer and light-emitting devices in manufacturing of light-emitting devices.

Referring to FIGS. 1 and 2, a plurality of light-emitting devices, for example, LED chips C, are formed on a wafer W, as illustrated in FIG. 2, by using a basic semiconductor process. The LED chips C may be formed by using a general method of forming semiconductor LEDs. Generally, the plurality of LED chips C, each include electrode pads, may be formed on one wafer W. As illustrated in FIG. 2, a LED chip C may have a square form and may include n-type and p-type electrode pads formed at corners thereof, respectively.

After the plurality of LED chips C are formed on the wafer W, The LED chips C are separated, the characteristics of each LED chip are investigated, and then, the LED chips are bin sorted according to their characteristics. The characteristics of the LED chips may be bin sorted into luminance wavelength, brightness, reaction rate, etc. For example, as illustrated in FIG. 2, the LED chips in a specific luminance wavelength may be selectively bin sorted based on a luminance wavelength of each LED chip.

After bin sorting the LED chips according to their characteristics, the LED chips in the same group are rearranged and lined on a carrier substrate, for example, a sapphire substrate. Hereinafter, the LED chips in the same group obtained by bin sorting according to characteristics of the LED chips are referred to as LED chips having the same characteristic. Intervals between the rearranged LED chips may be determined in consideration of a thickness of a phosphor to be deposited and a process of dicing the LED chips after depositing of the phosphor, and may be, for example, few micro meters to few hundreds of micro meters. The number of LED chips that are rearranged and lined on one carrier substrate is not particularly restricted.

After the LED chips having the same characteristic are arranged and lined on the carrier substrate, a molding process for depositing a phosphor on the LED chips is performed. Since luminance characteristics of the LED chips arranged on one carrier substrate are similar to each other, the phosphor may be easily selected so that a luminance characteristic of a LED package that is finally realized may be controlled and reliability thereof may be improved.

After the phosphor is deposited on the LED chips having the same characteristic, a dicing process for separating the LED chips arranged on the carrier substrate may be performed for forming a LED chip package. As described above, in order to facilitate the dicing process, the intervals between the LED chips arranged on the carrier substrate may be previously determined in consideration of the dicing process. Hereinafter, a process of depositing a phosphor on the LED chips rearranged and lined on the carrier substrate and an apparatus for depositing the phosphor used in the process of depositing a phosphor on the LED chips will be described more fully.

FIGS. 3A through 3D are cross-sectional diagrams illustrating coating of a phosphor on light-emitting devices rearranged and arranged on a carrier substrate 30 according to an embodiment of the present invention.

Figure 3:
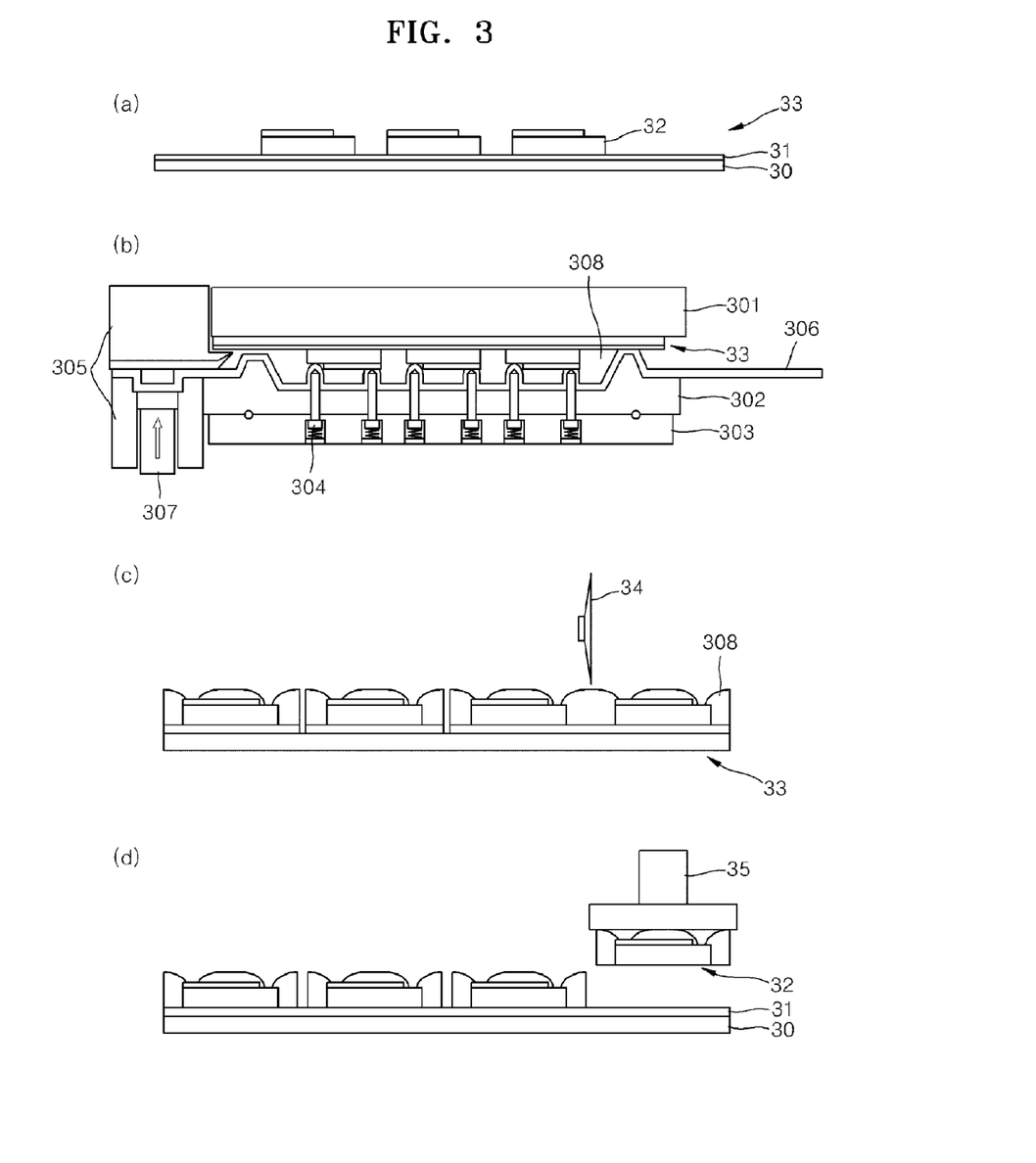
FIGS. 3A through 3D are cross-sectional diagrams illustrating coating of a phosphor using transfer molding, according to an embodiment of the present invention.

In FIG. 3A, light-emitting devices, for example, LED chips 32, are lined and arranged on the carrier substrate 30.

Referring to FIG. 3A, an adhesive layer 31 is formed on the carrier substrate 30, and the LED chips 32 are arranged on the adhesive layer 31. Here, the adhesive layer 31 is formed to fix the LED chips 32 on the carrier substrate 30, and may include, for example, photo-sensitive adhesive (PSA). A component of the adhesive layer 31 may be hardened through UV irradiation and a material for easily separating the LED chips 32 from the carrier substrate 30 may be used to form the adhesive layer 31. For reference, the adhesive layer 31 may be selectively formed. When the carrier substrate 30 is formed of a material that may easily fix the LED chips 32 thereon, the adhesive layer 31 may be omitted. The carrier substrate 30 may be formed of a flexible material or a hard sheet material and may include both an organic material and an inorganic material. Also, the carrier substrate 30 may be formed of a complex material obtained by impregnating an organic or inorganic polymer with a glass fiber.

In FIG. 3B, the carrier substrate 33 on which the LED chips 32 are formed is installed on an apparatus for depositing a phosphor according to an embodiment of the present invention and a phosphor is deposited on the carrier substrate 33. Here, the carrier substrate including the LED chip is represented by reference numeral 33.

Referring to FIG. 3B, the apparatus for depositing a phosphor according to an embodiment of the present invention includes an upper die 301 and a lower die 302, and the carrier substrate 33 on which the LED chips 32 are formed is installed on the upper die 301 of the apparatus for depositing a phosphor. A release film 306 used to easily separate a phosphor material and the lower die 302 after depositing a phosphor may be attached on the lower die 302. The release film 306 may include polyvinyl chloride (PVC) or polyethylene terephthalate (PET). Via pins 304 protrude from the lower die 302 through pin holes so as to apply pressure to the release film 306 to contact electrode pads of the LED chips 32. As described above, the release film 306 contacts the electrode pads of the LED chips 32 via the via pins 304 in order to prevent a phosphor to be deposited on the electrode pads of the LED chips 32 during depositing of a phosphor, and the electrode pads that are exposed after depositing a phosphor are connected to separate bonding wires through an additional process. After the carrier substrate 33 on which the LED chips 32 are formed is installed on the upper die 301 and the electrode pads of the LED chips 32 contact the release film 306 via the via pins 304, a phosphor material is supplied toward the carrier substrate 33 on which the LED chips 32 are formed by applying pressure from a plunger 307 of a pot block 305. The supplied phosphor material may be deposited on the LED chips 32 except for sides of the LED chips 32 and portions where via pins 304 contact the release film 306. When the phosphor material is applied, a phosphor layer 308 is formed between the upper die 301 and the release film 306 of the lower die 302. When depositing of the phosphor is completed, the interval between the upper die 301 and the lower die 302 is increased so as to separate the carrier substrate 33 on which the LED chips 32 are formed from the upper die 301 and the release film 306.

In FIG. 3C, in the carrier substrate 33 on which the LED chips 32 are formed, the phosphor layer 308 is deposited on the LED chips 32. Referring to FIG. 3C, the phosphor layer 308 is formed on the carrier substrate 33 on which the LED chips 32 are formed and the electrode pads on the LED chips 32 are exposed to the outside since the electrode pads on the LED chips 32 are released from the release film 306. The LED chips 32 formed on the carrier substrate 33 are each separated so as to form a LED chip package. In this regard, a cutter 34 is used to cut the phosphor layer 308 on the carrier substrate 33. Also, as illustrated in FIG. 3D, an individual LED chip 32 is separated from the adhesive layer 31 of the carrier substrate 30 by using a carrier 35.

Hereinafter, a method of deposing a phosphor, according to an embodiment of the present invention, will be described in detail with reference to FIGS. 4 and 5A through 5E.

Figure 4:
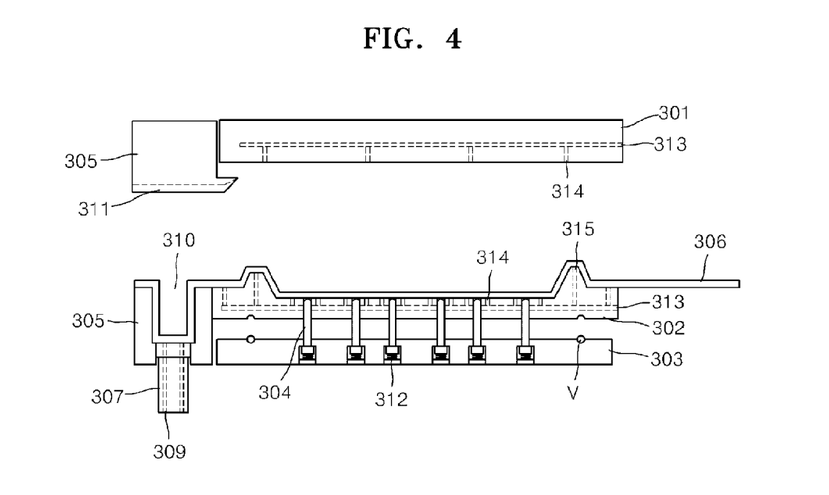
FIG. 4 is a cross-sectional diagram of an apparatus for coating a phosphor, according to an embodiment of the present invention.

FIG. 4 is a cross-sectional diagram of an apparatus for coating a phosphor, according to an embodiment of the present invention. In FIG. 4, the apparatus for coating a phosphor of FIG. 3B is illustrated in detail.

Referring to FIG. 4, the apparatus for coating a phosphor, according to the current embodiment of the present invention, includes the upper die 301 and the lower die 302, and the pot block 305 for supplying a phosphor material is formed at one side of the upper die 301 and the lower die 302. In FIG. 4, the pot block 305 is disposed at one side of the upper die 301 and the lower die 302. However, the upper die 301 and the lower die 302 are formed at both sides of the pot block 305 so as to supply a phosphor material to both the upper die 301 and the lower die 302 from the pot block 305.

The pot block 305 is divided into an upper part and a lower part, wherein a hole 310 is formed in the lower part and may function as a supply unit for injecting a phosphor paste to the upper die 301 and the lower die 302. The plunger 307 is formed at the bottom part of the hole 310 and may move upward and downward in the hole 310. When the plunger 307 applies pressure by moving upward and downward, a phosphor in the hole 310 may move to a space between the upper die 301 and the lower die 302, that is, a cavity. When the plunger 307 applies pressure in an upper direction of the hole 310, a vacuum hole 309 may be formed in the plunger 307 to discharge air in the upper part of the plunger 307.

A runner 311, which functions as a transport path through which the phosphor paste is transported, is formed on the bottom surface of the upper part of the pot block 305, that is, a part facing the lower part of the pot block 305. The runner 311 may be a groove-form structure formed in the upper part of the pot block 305. More specifically, when the plunger 307 pushes up the phosphor paste in the hole 310, the phosphor paste may be transported toward the cavity between the upper die 301 and the lower die 302. A plurality of grooves, through which the phosphor paste may flow, may be formed in the lower die 302 that is close to the pot block 305, and a width of a groove may be greater than the maximum size of the phosphor, for example, 300 micrometers or below.

A protrusion portion 315 for clamping a carrier substrate on which LED chips are formed is formed on the lower die 302. An air bent slit, which may function as an air discharge path, may be formed in the protrusion unit 315, and a width of the air bent slit may be a few to a few tens of micrometers.

A plurality of pin holes may be formed in the lower die 302, and the via pins 304 are arranged in each pin hole. The via pins 304 are connected to a pin drive plate 303 by springs 312. Since the pin drive plate 303 moves upward and downward, the via pins 304 may protrude from the pin holes of the lower die 302. When the carrier substrate, on which the LED chips are formed, is installed on the upper die 301, the via pins 304 may be disposed to correspond to the electrode pads of the LED chips. A thermally resistant sealing member V may be inserted between the pin drive plate 303 and the lower die 302 and grooves, into which the sealing member V is inserted, may be formed in the pin drive plate 303 and the lower die 302. The pin drive plate 303 is moved upward and is connected to the lower die 302, air tightness may be maintained by the sealing member V. In addition to the pin holes, a plurality of vacuum holes 314 may be formed in the lower die 302, wherein the vacuum holes 314 discharge air existing in the lower part of the pot block 305 and between the lower die 302 and the release film 306 through an air discharge hole 313 so that an adhesion property of the pot block 305, the lower die 302, and the release film 306 may be improved. Also, a plurality of vacuum holes may be formed in the lower surface of the upper die 301, wherein the vacuum holes may fix the carrier substrate, on which the LED chips are rearranged, to be stably installed on the upper die 301. The release film 306 may be formed of a polymer material having a high elongation property, by which the heat resistance thereof may be secured in a temperature range of about 100 to about 150° C., which is a molding temperature, and may include, for example, polyvinyl chloride (PVC) or polyethylene terephthalate (PET) as described above. A thickness of the release film 306 may be a few to a few tens of micrometers.

Depositing of a phosphor on the carrier substrate 33, on which the LED chips 32 are rearranged and lined, by using the apparatus for coating a phosphor of FIG. 4 is now described.

Figure 5A:
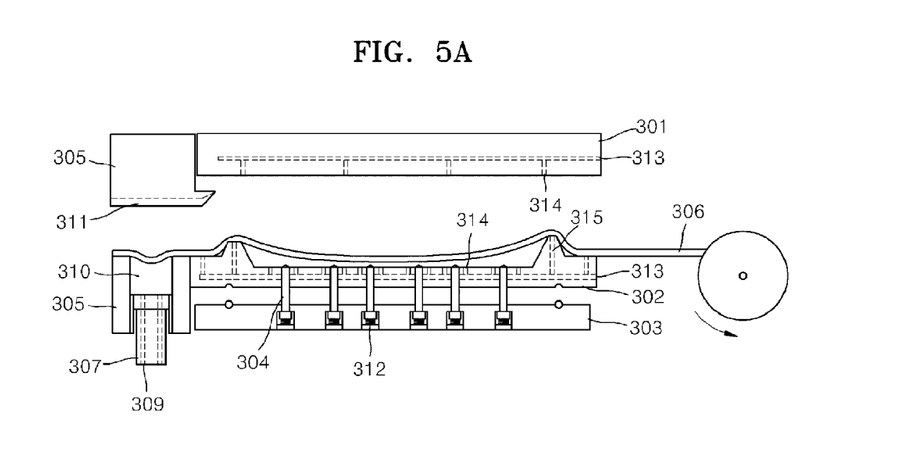
FIGS. 5A through 5E are cross-sectional diagrams illustrating a method of coating a phosphor on a carrier substrate, in which LED chips are rearranged and lined, by using an apparatus for depositing a phosphor.

Referring to FIG. 5A, the release film 306 on the lower die 302 is changed using, for example, a roller. A release film used in a previous phosphor molding process may be removed by being rolled due to, for example, rotation of the roller, and may be disposed on the lower die 302 and the pot block 305.

Figure 5B:
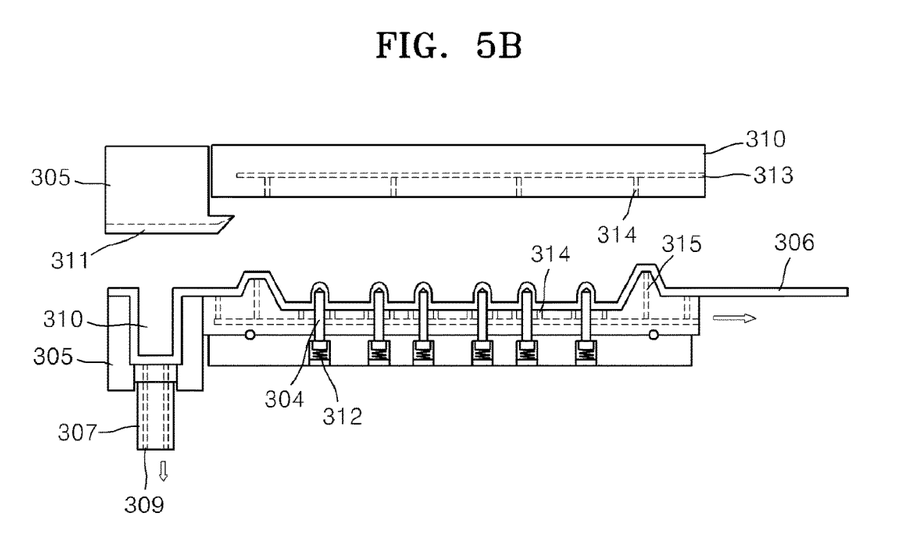

Referring to FIG. 5B, air existing between the lower die 302, the plunger 307 of the pot block 305, and the release film 306 is released to the outside through the air discharge hole 313 or the vacuum hole 309 so that the release film 306 may be adhered between the lower die 302 and the pot block 305. Here, the pin drive plate 303 moves upward so that the via pins 304 supported by the springs 312 may protrude from the lower die 302. As air existing between the via pins 304, the lower die 302, and the release film 306 is released, the release film 306 may be adhered to the via pins 304 and the lower die 302.

Figure 5C:
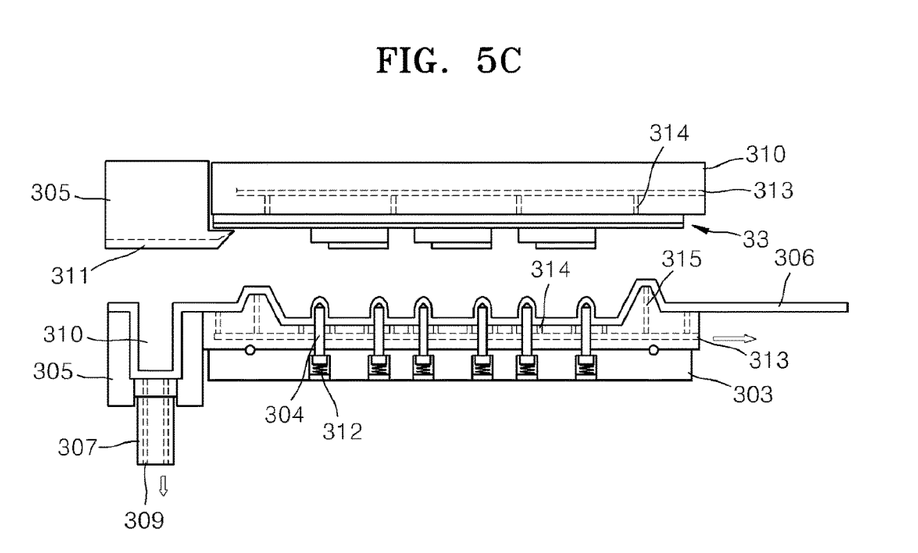

Referring to FIG. 5C, while air is released through the vacuum holes 314 and the air discharge hole 313, the carrier substrate 33, on which the LED chips 32 are rearranged and lined, is installed on the upper die 301. Also, a phosphor paste may be supplied to the hole 310 at the lower part of the pot block 305 by using dispensing.

Figure 5D:
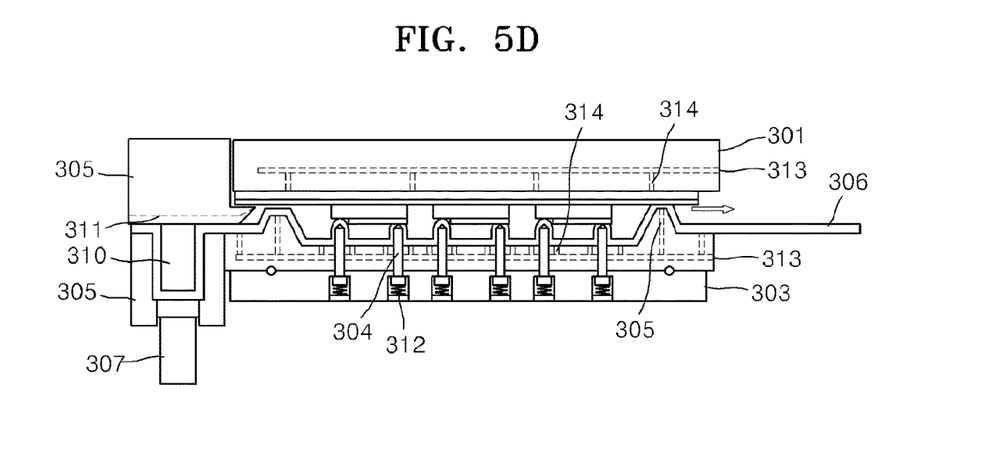

Referring to FIG. 5D, as the upper die 301 moves downward, the upper die 301 is adhered to the lower die 302. Here, in order to release air in the space between the upper die 301 and the lower die 302, that is, in the cavity, a vacuum process may be performed. As the upper die 301 and the lower die 302 are adhered to each other and the intervals between the via pins 314 and the electrode pads of the LED chips 32 are reduced, the release film 306 formed on the via pins 314 is adhered to the electrode pads. Accordingly, the phosphor paste may be prevented from contacting the electrode pads of the LED chips 32. Even if heights of the cross-sections of the via pins 314 are different from each other, a height deviation may be adjusted by the springs 312 and thus the release film 306 on the via pins 314 may be stably adhered to the electrode pads of the LED chips 32.

Figure 5E:
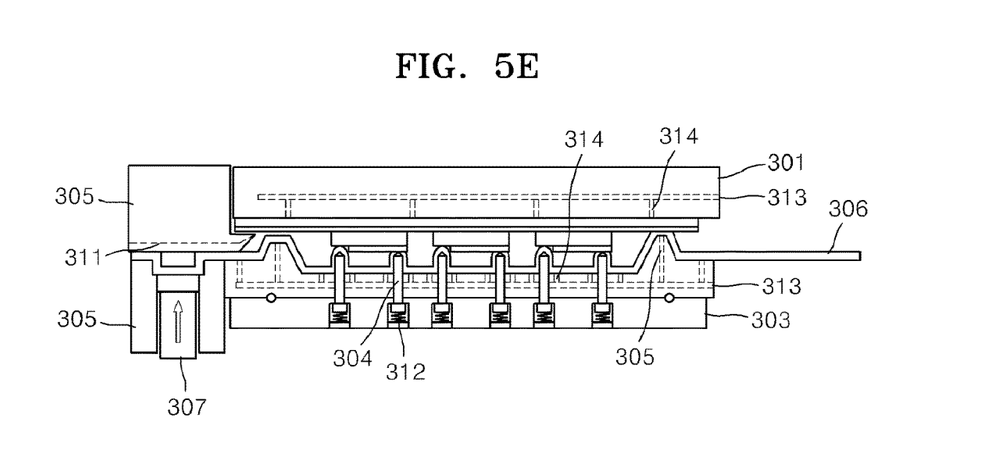

Referring to FIG. 5E, the plunger 307 at the lower part of the pot block 305 moves upward, the phosphor paste existing in the hole 310 at the lower side of the pot block 305 is supplied to the cavity interposed between the upper die 301 and the lower die 302 through the runner 311 at the lower part of the pot block 305. In this regard, the phosphor paste supplied from the pot block 305 may be deposited on the upper surfaces and sides of the LED chips 32. According to the depositing of the phosphor using transfer molding, the phosphor may be easily deposited on the sides and upper surfaces of the LED chips 32, except for the electrode pads. Since the LED chips having the same characteristics are already rearranged, a phosphor paste may be easily selected according to the luminance characteristics of the LED chips and thus white LEDs having reliable optical characteristics may be easily manufactured.

Various LED packages may be manufactured using the method of depositing a phosphor according to the embodiment of the present invention and the LED chips on the carrier substrate are separated through a dicing process, thereby forming a desired LED package.

According to the embodiments of the present invention, light-emitting devices having the same luminance characteristic are rearranged and a phosphor is deposited thereto using transfer molding so that the phosphor may be uniformly deposited on the upper surfaces and sides of the light-emitting devices and consequently, white light-emitting devices having uniform luminance characteristics may be provided.

In addition, the transfer molding apparatus, which may uniformly deposit a phosphor on the sides and the upper surfaces of the light-emitting devices, may be provided.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of depositing a phosphor using transfer molding, the method comprising:
   forming a plurality of light-emitting devices on a wafer and arranging the light-emitting devices on a carrier substrate according to luminance characteristics by examining the luminance characteristics of the plurality of light-emitting devices;
   separating the light-emitting devices from each other after forming the plurality of light-emitting devices on the wafer and prior to arranging the light-emitting devices on the carrier substrate;
   installing the carrier substrate for the arranged light emitting devices to be disposed inside a cavity of a transfer molding apparatus, the transfer molding apparatus comprising an upper die and a lower die forming the cavity;
   attaching a release film on the lower die of the transfer molding apparatus;
   depositing the phosphor on the arranged light-emitting devices using transfer molding; and
   separating the light-emitting devices from the carrier substrate,
   wherein in the examining of the luminance characteristics of the plurality of light-emitting devices, the luminance characteristics of each light-emitting device are examined after the plurality of light-emitting devices formed on the wafer are separated from each other.

2. The method of claim 1, wherein in the examining of the luminance characteristics, luminance wavelength, brightness, or reaction rate of each light-emitting device is examined.

3. The method of claim 1, wherein in the arranging of the light-emitting devices on the carrier substrate, an adhesive layer is formed on the carrier substrate and LED chips having the same luminance characteristics are arranged on the adhesive layer.

4. The method of claim 3, wherein the adhesive layer comprises a photo-sensitive adhesive (PSA).

5. The method of claim 1, wherein in the depositing of the phosphor, the carrier substrate, on which the light-emitting devices are arranged, is installed on the upper die and the phosphor is supplied to the light-emitting devices on the carrier substrate so as to deposit the phosphor on the light-emitting devices.

6. The method of claim 5, wherein the phosphor is deposited on the light-emitting devices except for electrode pads of the light-emitting devices.

7. The method of claim 1, further comprising: sorting the plurality of light emitting devices according to characteristics of the light emitting devices; and
   transferring phosphor on the arranged light emitting devices in the cavity of the transfer molding apparatus.

8. The method of claim 7, wherein installing the carrier substrate comprises installing the carrier substrate on the upper die of the cavity, and
   wherein attaching the release film on the lower die is performed before the installing the carrier substrate on the upper die.

9. The method of claim 1, wherein the transfer molding apparatus further comprising:
   a plunger applying pressure to provide phosphor to the cavity; and
   a hole discharging air from the cavity.

10. A method of depositing a phosphor using transfer molding, the method comprising:
    forming a plurality of light-emitting devices on a wafer and arranging the light-emitting devices on a carrier substrate according to luminance characteristics of the plurality of light-emitting devices by examining the luminance characteristics of the plurality of light-emitting devices;
    installing the carrier substrate for the arranged light emitting devices to be disposed inside a cavity of a transfer molding apparatus, the transfer molding apparatus comprising an upper die and a lower die forming the cavity;

attaching a release film on the lower die of the transfer molding apparatus;

depositing the phosphor on the arranged light-emitting devices using transfer molding;

separating the light-emitting devices from the carrier substrate; and separating the plurality of light-emitting devices from the wafer prior to the arranging the light emitting devices on the carrier substrate, wherein the examining luminance characteristics of each of the plurality of light-emitting devices is performed after the separating of the plurality of light-emitting devices from the wafer.

11. The method of claim 10, wherein the depositing of the phosphor is performed in a cavity of a transfer molding apparatus.

12. The method of claim 11, wherein the transfer molding apparatus further comprises:

a pot block formed at one side of the upper die and the lower die configured for supplying a phosphor material between the upper die and the lower die, wherein the pot block comprises a hole and a plunger formed at a bottom part of the hole, the plunger being configured to move upward and downward in the hole to apply pressure for transporting the phosphor material between the upper die and the lower die, wherein a carrier substrate on which light-emitting devices are arranged is installed on the upper die, wherein the lower die is formed correspond to the upper die.

13. The method of claim 11, wherein the transfer molding apparatus further comprises:

a pot block formed at one side of the upper die and the lower die for supplying a phosphor material between the upper die and the lower die; and a release film contacting the lower die and a lower part of the pot block, wherein the carrier substrate on which light-emitting devices are arranged is installed on the upper die, wherein the lower die is formed to correspond to the upper die.

14. A method of depositing a phosphor using transfer molding, the method comprising:

forming a plurality of light-emitting devices on a wafer and arranging the light-emitting devices on a carrier substrate according to luminance characteristics of the plurality of light-emitting devices by examining the luminance characteristics of the plurality of light-emitting devices;

installing the carrier substrate for the arranged light emitting devices to be disposed inside a cavity of a transfer molding apparatus, the transfer molding apparatus comprising an upper die and a lower die forming the cavity;

attaching a release film on the lower die of the transfer molding apparatus;

depositing the phosphor on the arranged light-emitting devices using transfer molding; and separating the light-emitting devices from the carrier substrate; and separating the plurality of light-emitting devices formed on the wafer from each other, wherein the examining the luminance characteristics of the plurality of light-emitting devices is performed after separating the plurality of light-emitting devices from each other, wherein the installing the carrier substrate inside the cavity of the transfer molding apparatus comprises disposing the carrier substrate above the release film, wherein the disposing the phosphor on the arranged light-emitting devices comprises providing the phosphor between the arranged light-emitting devices and the release film, and wherein the release film contacts electrode pads of the light-emitting devices while disposing the phosphor on the arranged light-emitting devices.

15. The method of claim 14, wherein the release film comprises polyvinyl chloride (PVC) or polyethylene terephthalate (PET).

* * * * *